(12) United States Patent
Yun et al.

(10) Patent No.: US 9,111,805 B2
(45) Date of Patent: Aug. 18, 2015

(54) THIN FILM TRANSISTOR PANEL HAVING AN ETCH STOPPER ON SEMICONDUCTOR

(71) Applicant: Samsung Display Co., Ltd., Yongin (KR)

(72) Inventors: Pil-Sang Yun, Seoul (KR); Ki-Won Kim, Suwon-si (KR); Hye-Young Ryu, Seoul (KR); Woo-Geun Lee, Yongin-si (KR); Seung-Ha Choi, Suwon-si (KR); Jae-Hyoung Youn, Hwaseong-si (KR); Kyoung-Jae Chung, Seoul (KR); Young-Wook Lee, Suwon-si (KR); Je-Hun Lee, Seoul (KR); Kap-Soo Yoon, Seoul (KR); Do-Hyun Kim, Seongnam-si (KR); Dong-Ju Yang, Seoul (KR); Young-Joo Choi, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/230,787

(22) Filed: Mar. 31, 2014

(65) Prior Publication Data

US 2014/0209903 A1 Jul. 31, 2014

Related U.S. Application Data

(62) Division of application No. 12/957,743, filed on Dec. 1, 2010, now Pat. No. 8,723,179.

(30) Foreign Application Priority Data

Feb. 11, 2010 (KR) .................. 10-2010-0012957

(51) Int. Cl.
*H01L 29/04* (2006.01)
*H01L 31/036* (2006.01)
(Continued)

(52) U.S. Cl.
CPC .......... *H01L 27/1225* (2013.01); *H01L 27/127* (2013.01); *H01L 27/1214* (2013.01); *H01L 27/1288* (2013.01); *H01L 29/66969* (2013.01); *H01L 29/7869* (2013.01)

(58) Field of Classification Search
CPC ............ H01L 27/1214; H01L 27/3274; H01L 29/0847; H01L 29/41733; H01L 29/42384; H01L 29/4908; H01L 29/7831; H01L 29/786; H01L 2924/13069
See application file for complete search history.

(56) References Cited

U.S. PATENT DOCUMENTS

2008/0176364 A1 7/2008 Yang et al.
2009/0321731 A1 12/2009 Jeong et al.
(Continued)

FOREIGN PATENT DOCUMENTS

JP 2000-194003 7/2000
JP 2005-077822 3/2005
(Continued)

OTHER PUBLICATIONS

Non-Final Office Action issued on Nov. 30, 2012 in U.S. Appl. No. 12/957,743.
(Continued)

*Primary Examiner* — Hoai V Pham
(74) *Attorney, Agent, or Firm* — H.C. Park & Associates, PLC

(57) ABSTRACT

A thin film transistor panel includes an insulating substrate, a gate insulating layer disposed on the insulating substrate, an oxide semiconductor layer disposed on the gate insulating layer, an etch stopper disposed on the oxide semiconductor layer, and a source electrode and a drain electrode disposed on the etch stopper.

11 Claims, 8 Drawing Sheets

(51) Int. Cl.
 *H01L 31/0376* (2006.01)
 *H01L 31/20* (2006.01)
 *H01L 27/12* (2006.01)
 *H01L 29/786* (2006.01)
 *H01L 29/66* (2006.01)

(56) References Cited

U.S. PATENT DOCUMENTS

| | | | |
|---|---|---|---|
| 2010/0025675 A1* | 2/2010 | Yamazaki et al. | 257/43 |
| 2010/0035379 A1 | 2/2010 | Miyairi et al. | |
| 2010/0127266 A1* | 5/2010 | Saito et al. | 257/59 |
| 2010/0155717 A1* | 6/2010 | Yano et al. | 257/43 |
| 2011/0108834 A1 | 5/2011 | Yamazaki et al. | |
| 2011/0128491 A1* | 6/2011 | Kubota et al. | 349/139 |

FOREIGN PATENT DOCUMENTS

| | | |
|---|---|---|
| JP | 2005-285890 | 10/2005 |
| JP | 2007-157916 | 6/2007 |
| JP | 2008-166716 | 7/2008 |

OTHER PUBLICATIONS

Final Office Action issued on Apr. 5, 2013 in U.S. Appl. No. 12/957,743.
Non-Final Office Action issued on Jul. 11, 2013 in U.S. Appl. No. 12/957,743.
Final Office Action issued on Oct. 11, 2013 in U.S. Appl. No. 12/957,743.
Notice of Allowance issued on Dec. 31, 2013 in U.S. Appl. No. 12/957,743.

* cited by examiner

THIN FILM TRANSISTOR PANEL HAVING AN ETCH STOPPER ON SEMICONDUCTOR

CROSS-REFERENCE TO RELATED APPLICATIONS

This application is a divisional of U.S. patent application Ser. No. 12/957,743, filed on Dec. 1, 2010, and claims priority from and the benefit of Korean Patent Application No. 10-2010-0012957, filed on Feb. 11, 2010, which is hereby incorporated by reference for all purposes as if fully set forth herein.

BACKGROUND OF THE INVENTION

1. Field of the Invention

Exemplary embodiments of the present invention relate to a thin film transistor panel and a method for fabricating a thin film transistor panel.

2. Discussion of the Background

A flat panel display, such as a liquid crystal display (LCD) or an organic light emitting display (OLED), typically includes pairs of field generating electrodes and an electro-optical active layer disposed between each pair of field generating electrodes.

A pixel electrode, which is one electrode of the pair of field generating electrodes, can be connected to a switching element that transmits electrical signals to the pixel electrode. The electro-optical active layer operates in response to the electrical signal, thereby displaying images.

A thin film transistor (TFT) is typically used for the switching element that is connected to the pixel electrode. A TFT includes a gate electrode, a source electrode, a drain electrode, and an active layer disposed between the gate electrode and the source electrode and the drain electrode. The active layer may include amorphous silicon or polycrystalline silicon.

High-mobility TFTs should be used with larger flat panel displays. A TFT having an oxide semiconductor as an active layer has shown high performance. The typical TFT fabrication process involves depositing and patterning multiple layers. But when fabricating a TFT having source and drain electrodes on an oxide semiconductor active layer, the oxide semiconductor active layer may be damaged when forming the source and the drain electrodes, thereby degrading the TFT's characteristics.

To reduce or prevent this damage, as disclosed in JP 2005-285890, a channel protection layer may be formed on the oxide semiconductor active layer before forming the source and the drain electrodes. However, forming the channel protection layer on the oxide semiconductor active layer can increase the number of photolithographic processes used to manufacture the TFT, thereby increasing the time and cost to manufacture the TFT panel.

SUMMARY OF THE INVENTION

Exemplary embodiments of the present invention provide a thin film transistor (TFT) panel in which damage to a TFT's oxide semiconductor active layer may be reduced or prevented without increasing the number of photolithographic processes.

Additional features of the invention will be set forth in the description which follows, and in part will be apparent from the description, or may be learned by practice of the invention.

An exemplary embodiment of the present invention discloses a method for forming a panel including a thin film transistor. The method includes forming an oxide semiconductor pattern including a channel region, forming an etch stopper at a position corresponding to the channel region, and forming a first electrode and a second electrode spaced apart from the first electrode. The channel region is configured to connect the first electrode to the second electrode. The oxide semiconductor pattern, the first electrode, and the second electrode are formed using a first mask.

An exemplary embodiment of the present invention also discloses a panel including a thin film transistor. The panel includes a substrate, a first electrode on the substrate, a first insulating layer on the first electrode, and an oxide semiconductor pattern on the first insulating layer. The oxide semiconductor pattern includes a channel region. An etch stopper is disposed on the oxide semiconductor pattern, and a conductive layer is disposed on the substrate. The conductive layer includes a signal line, a second electrode, and a third electrode. The second electrode and the third electrode are disposed on the etch stopper and the oxide semiconductor pattern. Except for the channel region of the oxide semiconductor pattern, sidewalls of the oxide semiconductor pattern substantially coincide with sidewalls of the signal line, the second electrode, and the third electrode.

An exemplary embodiment of the present invention also discloses a method for forming a panel including a thin film transistor. The method includes forming an oxide semiconductor pattern including a channel region, forming an etch stopper at a position corresponding to the channel region, and forming a first electrode and a second electrode spaced apart from the first electrode. The channel region is configured to connect the first electrode to the second electrode. The etch stopper and the oxide semiconductor pattern are formed using a first mask.

An exemplary embodiment of the present invention also discloses a panel including a thin film transistor. The panel includes a substrate, a first electrode on the substrate, a first insulating layer on the first electrode, an oxide semiconductor pattern on the first insulating layer, an etch stopper on the oxide semiconductor pattern, and a second electrode and a third electrode on the etch stopper and the oxide semiconductor pattern. The first insulating layer includes a first region disposed under the etch stopper and a second region disposed outside the first region. A thickness of the first region differs from a thickness of the second region.

An exemplary embodiment of the present invention also discloses a panel including a thin film transistor. The panel includes a substrate, a first electrode on the substrate, a first insulating layer on the first electrode, an oxide semiconductor pattern on the first insulating layer, an etch stopper on the oxide semiconductor pattern, and a second electrode and a third electrode on the etch stopper and the oxide semiconductor pattern. A pattern of the etch stopper is contained entirely within a perimeter of the oxide semiconductor pattern, and distances between corresponding sidewalls of the etch stopper and the oxide semiconductor pattern are substantially the same.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
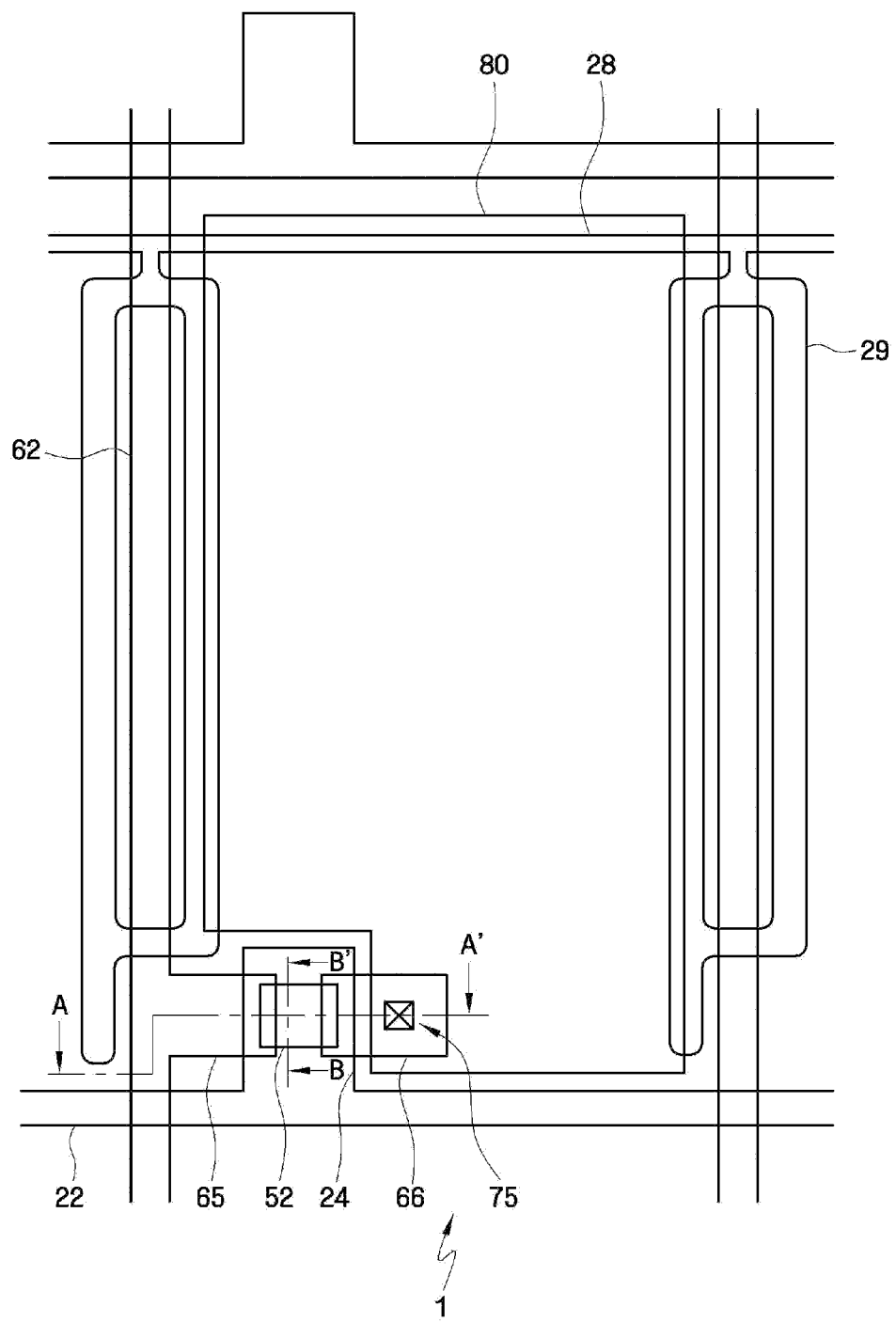
FIG. 1 is a plan view of a thin film transistor (TFT) panel according to an exemplary embodiment the present invention.

Exemplary embodiments of the present invention now will be described more fully hereinafter with reference to the accompanying drawings. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. Like reference numerals refer to like elements throughout.

It will be understood that when an element or layer is referred to as being "on", "connected to" or "connected to" another element or layer, it can be directly on, connected or connected to the other element or layer or intervening elements or layers may be present. In contrast, when an element is referred to as being "directly on," "directly connected to" or "directly connected to" another element or layer, there are no intervening elements or layers present. As used herein, the term "and/or" includes any and all combinations of one or more of the associated items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the exemplary embodiments of the invention and does not pose a limitation on the scope of the invention unless otherwise claimed. No language in the specification should be construed as indicating any non-claimed element as essential to the practice of the invention as used herein.

Hereinafter, exemplary embodiments of the present invention will be described in detail with reference to the accompanying drawings.

Figure 2A:
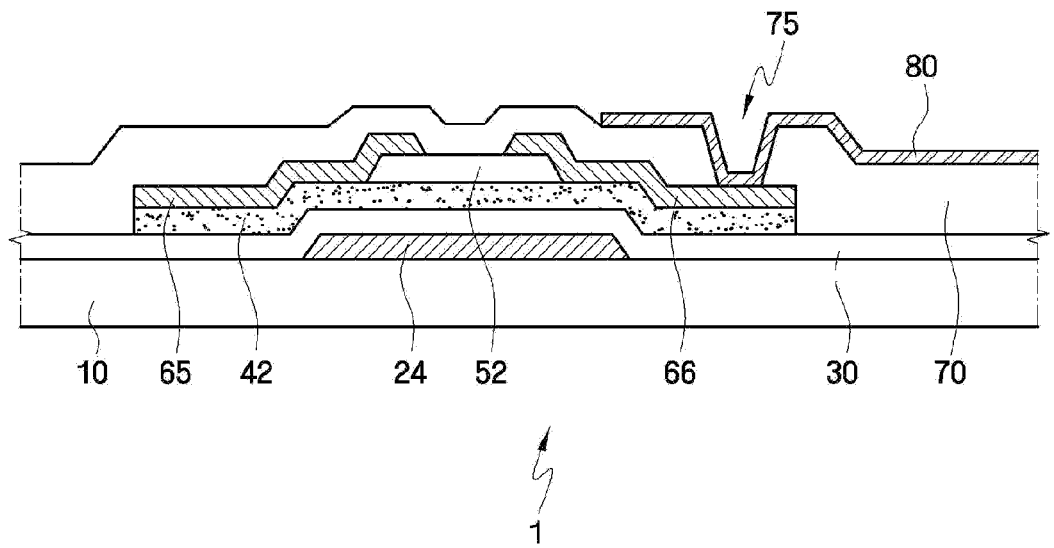
FIG. 2A is a cross-sectional view taken along line A-A' of FIG. 1.
Figure 2B:
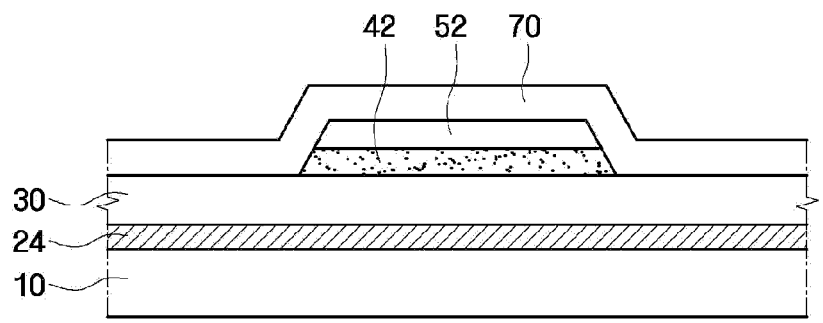
FIG. 2B is a cross-sectional view taken along line B-B' of FIG. 1.

FIG. 1 is a plan view of a thin film transistor (TFT) panel 1 according to an exemplary embodiment the present invention. FIG. 2A is a cross-sectional view taken along line A-A' of FIG. 1, and FIG. 2B is a cross-sectional view taken along line B-B' of FIG. 1. While only a single pixel of the TFT panel 1 is shown in FIG. 1, one of ordinary skill in the art may appreciate that the TFT panel 1 may have multiple pixels, and according to an exemplary embodiment of the present invention, they may be disposed in a matrix on the TFT panel 1.

Referring to FIG. 1, FIG. 2A, and FIG. 2B, multiple gate lines 22 and storage electrode lines 28 are formed on an insulating substrate 10. The insulating substrate 10 may be made of glass, plastic, or other suitable insulating materials.

The gate lines 22, which extend in a first direction, transmit gate signals. Each gate line 22 includes gate electrodes 24 that protrude from the gate line 22 and a gate pad (not shown). A driving circuit, such as a gate driving circuit, applies driving signals to the gate pad. Alternatively, the gate pad may be omitted and the gate lines 22 may receive driving signals from a driving circuit disposed on the substrate 10.

The storage electrode lines 28 extend parallel with the gate lines 22. Each storage electrode line 28 includes storage electrodes 29 that protrude from the storage electrode line 28. The storage electrodes 29 are arranged parallel with a corresponding data line 62. The storage electrode 29 includes an opening in its central portion. Thus, the storage electrode 29 may have a tetragonal ring shape. In this case, a portion of the opening may be disposed to overlap with the data line 62. The storage electrode line 28 may receive a preset voltage. The storage electrode lines 28 and the storage electrodes 29 can have various shapes and arrangements. Alternative exemplary embodiments also include configurations in which the storage electrode lines 28 are omitted.

The gate lines 22 and the storage electrode lines 28 can be made of various conductive materials. For example, the gate lines 22 and the storage electrode lines 28 can include aluminum (Al) or an aluminum alloy, silver (Ag) or a silver alloy, copper (Cu) or a copper alloy, molybdenum (Mo) or a molybdenum alloy, chromium (Cr), tantalum (Ta), and titanium (Ti). According to an exemplary embodiment, the gate lines 22 and the storage electrode lines 28 can include multiple layers made of various conductive materials. For example, they may include a double-layered structure such Al and Mo or Ti and Cu.

A gate insulating layer 30 is formed on the insulating substrate 10, the gate lines 22, and the storage electrode lines 28. The gate insulating layer 30 can include an insulating material such as silicon nitride (SiNx), silicon oxide (SiOx), silicon oxynitride (SiON), or other appropriate insulating materials. The gate insulating layer 30 can include multiple layers made of various insulating materials. For example, the gate insulating layer 30 can include a double-layered structure of a lower layer of SiNx and an upper layer of SiOx.

An oxide semiconductor layer 42, which includes a channel region of a TFT, is formed on the gate insulating layer 30. The effective carrier mobility of an oxide semiconductor may be two to one hundred times greater than that of amorphous silicon. The oxide semiconductor layer 42 may include one or more compounds represented by the formulas $A_xB_xO_x$ and $A_xB_xC_xO_x$. Here, A may be In, Zn, Ga, Hf, or Cd; B may be Zn, Ga, Sn, or In; C may be Sn, Zn, Cd, Ga, In, or Hf; and O is atomic oxygen. Each x is independently a non-zero integer, and A, B, and C are different from one another. For example, the oxide semiconductor layer 42 can include one or more of the following compounds: InZnO, InGaO, InSnO, ZnSnO, GaSnO, GaZnO, GaZnSnO, GaInZnO, and HfInZnO.

An etch stopper 52 is formed on the oxide semiconductor layer 42. The etch stopper 52 covers the channel region of the oxide semiconductor layer 42, thereby preventing or reducing damage to the channel region caused by an etching solution, an etching gas, or plasma used during a subsequent manufacturing process. The etch stopper 52 may be made of an is insulating material. For example, the etch stopper 52 may be made of SiOx, SiNx or other appropriate insulating materials. Generally, the channel region refers to a portion of a semiconductor layer that forms a current path between a source electrode and a drain electrode.

Multiple data lines 62 and drain electrodes 66 are formed on the gate insulating layer 30, the oxide semiconductor layer 42, and the etch stopper 52. The data lines 62 transmit data signals and extend in a second direction crossing the gate lines 22. Each data line 62 includes source electrodes 65 that protrude toward corresponding gate electrodes 24. The drain electrode 66 is disposed opposite to and spaced apart from the corresponding source electrode 65 with respect to the gate electrode 24. A portion of the oxide semiconductor layer 42 between the source electrode 65 and the drain electrode 66 forms the TFT's channel.

The source electrode 65 and the drain electrode 66 may be formed on sidewalls of the etch stopper 52, as well as on a portion of a top surface of the etch stopper 52 that extends from the sidewalls. As noted above, the source electrode 65 is spaced apart from the drain electrode 66. Thus, the source electrode 65 and the drain electrode 66 expose a portion of the top surface of the etch stopper 52.

As described in detail below, the data line 62, source electrode 65, drain electrode 66, and oxide semiconductor layer 42 may be formed using the same mask. Consequently, except for the portion of the oxide semiconductor layer 42 between the source and drain electrodes 65 and 66 (i.e., the channel region), the oxide semiconductor layer 42 can have substantially the same shape as the data line 62, source electrode 65, and drain electrode 66. In this case, the data line 62, source electrode 65, and drain electrode 66 are not disposed directly on sidewalls of the oxide semiconductor layer 42. Further, because the same mask is used, as FIG. 2A shows, the sidewalls of the oxide semiconductor layer 42, except for the channel region, substantially coincide with the sidewalls of the data line 62, source electrode 65, and drain electrode 66. Furthermore, as FIG. 2B shows, sidewalls of the channel region of the oxide semiconductor layer 42 substantially coincide with sidewalls of the etch stopper 52.

Although FIG. 2A shows sidewalls of the oxide semiconductor layer 42 formed along the same line as the sidewalls of the data line 62, source electrode 65, and drain electrode 66, the actual manufacturing process will likely not produce such alignment. For example, because of the materials and etchants used to manufacture the TFT panel 1, the sidewalls may be curved or not formed in the same line. Thus, for the sidewalls to "substantially coincide with" each other as described here, it is not necessary for the sidewalls be formed along the same line as shown in FIG. 2A. Rather, as noted above, the sidewalls of the oxide semiconductor layer 42 substantially coincide with the sidewalls of the data line 62, source electrode 65, and drain electrode 66 because the same mask is used to form these elements. Similarly, although FIG. 2B shows sidewalls of the channel region of the oxide semiconductor layer 42 formed along the same line as the sidewalls of the etch stopper 52, the actual manufacturing process will likely not produce such alignment. Thus, for the sidewalls to "substantially coincide with" each other as described here, it is not necessary for the sidewalls be formed along the same line as shown in FIG. 2B. Rather, sidewalls of the channel region of the oxide semiconductor layer 42 substantially coincide with sidewalls of the etch stopper 52 because the etch stopper 52 masks the channel region during the process of patterning the oxide semiconductor film 40.

If the work function of the data line 62, source electrode 65, and drain electrode 66 is lower than that of the oxide semiconductor layer 42, the data line 62, source electrode 65, and drain electrode 66 can be formed directly on the oxide semiconductor layer 42 to form an ohmic contact.

The data line 62, source electrode 65, and the drain electrode 66 can include various conductive materials. For example, they may include nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), zirconium (Zr), tungsten (W), platinum (Pt), hafnium (Hf), or an alloy thereof. Further, the data line 62, source electrode 65, and drain electrode 66 can include oxygen (O) or nitrogen (N).

The data line 62, source electrode 65, and drain electrode 66 can have a multiple layered structure. For example, the data line 62, source electrode 65, and drain electrode 66 can have a double-layered structure including a lower layer and an upper layer. In this case, the lower layer can include titanium (Ti), titanium nitride (TiNx), a copper alloy such as copper manganese (CuMn), or other materials having similar characteristics, and the upper layer can include copper (Cu) or a copper alloy or other material having similar characteristics. In another alternative, the data line 62, source electrode 65, and drain electrode 66 can have a multi-layered structure including a lower molybdenum (Mo) layer, an aluminum (Al) layer on the lower Mo layer, and an upper Mo layer on the Al layer, or other appropriate conductive materials.

A passivation layer 70 is disposed on the etch stopper 52, the data line 62, the source electrode 65, the drain electrode 66, and the gate insulating layer 30. The passivation layer 70 can include an insulating material such as silicon oxide (SiOx), silicon nitride (SiNx), silicon oxynitride (SiON), or other appropriate insulating materials. The passivation layer 70 may include multiple layers. For example, the passivation layer 70 can include a double-layered structure of SiOx and SiNx. Further, the passivation layer 70 can also include an organic layer instead of or in addition to an inorganic layer.

A pixel electrode 80 is disposed on the passivation layer 70 and connected to the drain electrode 66 through the contact hole 75. The pixel electrode 80 can include a transparent conductive material such as indium tin oxide (ITO) and indium zinc oxide (IZO).

FIG. 3, FIG. 4, FIG. 5, and FIG. 6 are cross-sectional views showing steps for manufacturing the TFT panel 1 of FIG. 1 according to an exemplary embodiment of the present invention.

Figure 3:
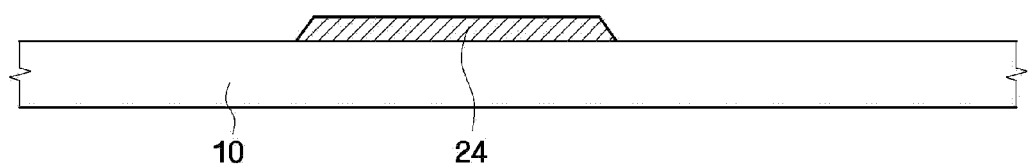
FIG. 3, FIG. 4, FIG. 5, and FIG. 6 are cross-sectional views showing steps for manufacturing the TFT panel of FIG. 1 according to an exemplary embodiment of the present invention.

Referring to FIG. 1 and FIG. 3, a gate conductive layer (not shown) is formed on an insulating substrate 10, e.g. by sputtering, and patterned using a photolithographic process to form a gate line 22, gate electrode 24, storage electrode line 28, and storage electrode 29. A dry etch process or a wet etch process can be used to pattern the gate conductive layer. If the gate conductive layer is wet etched, etchant such as phosphoric acid, nitric acid, and acetic acid can be used. If the gate conductive layer is dry etched, chlorine based gas such as $Cl_2$ and $BCl_3$ can be used.

The insulating substrate 10 can include glass, such as soda lime glass and boron silicate glass, or plastic. The gate conductive layer can include a double-layered structure such as Al and Mo, or Ti and Cu or other appropriate conductive materials.

Figure 4:
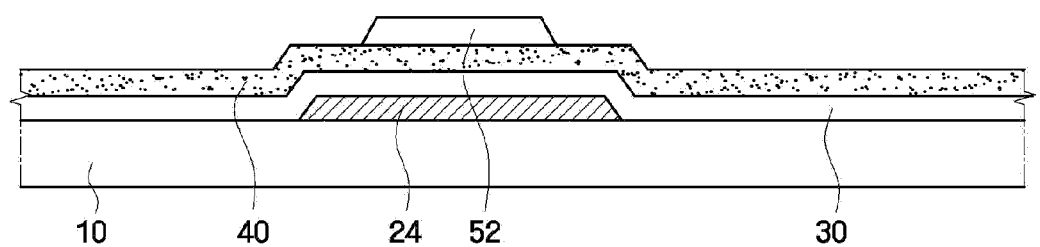

Referring to FIG. 1 and FIG. 4, a gate insulating layer 30 is formed, e.g. by chemical vapor deposition (CVD), on the gate line 22 and the storage electrode line 28. An oxide semiconductor film 40 is formed, e.g. by sputtering, on the gate insulating layer 30, and an etch stopper layer (not shown) is formed, e.g. by CVD, on the oxide semiconductor film 40. The etch stopper layer may be patterned using a photolithographic process to form an etch stopper 52. The etch stopper layer may be patterned using a dry etch process. The dry etch process can be performed using at least one of $CF_3$, $CHF_6$, and $Cl_2$ as etching gases.

Figure 5:
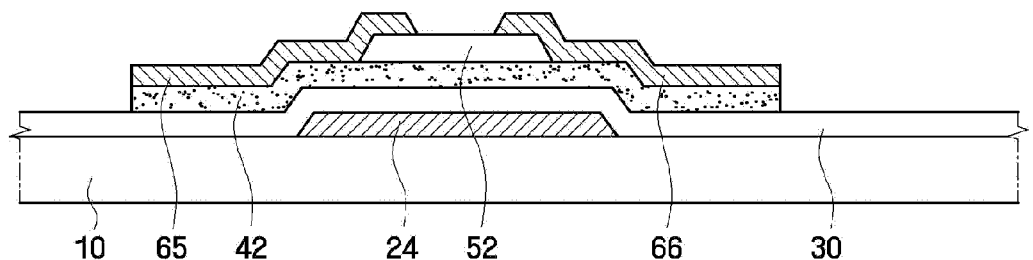

Referring to FIG. 1 and FIG. 5, a data conductive layer (not shown) is formed, e.g. by sputtering, on the etch stopper 52 and the oxide semiconductor film 40. The data conductive layer and the oxide semiconductor film 40 may be patterned using a photolithographic process and a single mask, thereby forming a data line 62, which includes a source electrode 65, a drain electrode 66, and an oxide semiconductor layer 42. The source electrode 65 and the drain electrode 66 are spaced apart from each other with respect to the gate electrode 24. A portion of the etch stopper 52 between the source electrode 65 and the drain electrode 66 is exposed, and the source electrode 65 and the drain electrode 66 cover a portion of the top surface and sidewalls of the etch stopper 52.

The data conductive layer and the oxide semiconductor film 40 may be patterned using a wet etch process. In this case, the etch stopper 52 and the gate insulating layer 30 may be resistant to, and thus not damaged by, chemicals used in the wet etch process. Accordingly, the etch stopper 52 can protect the underlying oxide semiconductor layer 42 from damage from chemicals.

As noted above, the data conductive layer and the oxide semiconductor film 40 may be patterned using a single mask. Consequently, except for the portion between the source and drain electrodes 65 and 66 (i.e., the channel region), the oxide semiconductor layer 42 can have substantially the same shape as the data line 62, source electrode 65, and drain electrode 66. Thus, in this case, as FIG. 2A shows, the data line 62, source electrode 65, and drain electrode 66 are not disposed directly on sidewalls of the oxide semiconductor layer 42. Further, because the same mask is used to pattern the data conductive layer and the oxide semiconductor film 40, except for the channel region, the sidewalls of the oxide semiconductor layer 42 substantially coincide with the sidewalls of the data line 62, source electrode 65, and drain electrode 66. Furthermore, as FIG. 2B shows, sidewalls of the channel region of the oxide semiconductor layer 42 substantially coincide with sidewalls of the etch stopper 52 because the etch stopper 52 masks the channel region during the process of patterning the data conductive layer and the oxide semiconductor film 40.

Figure 6:
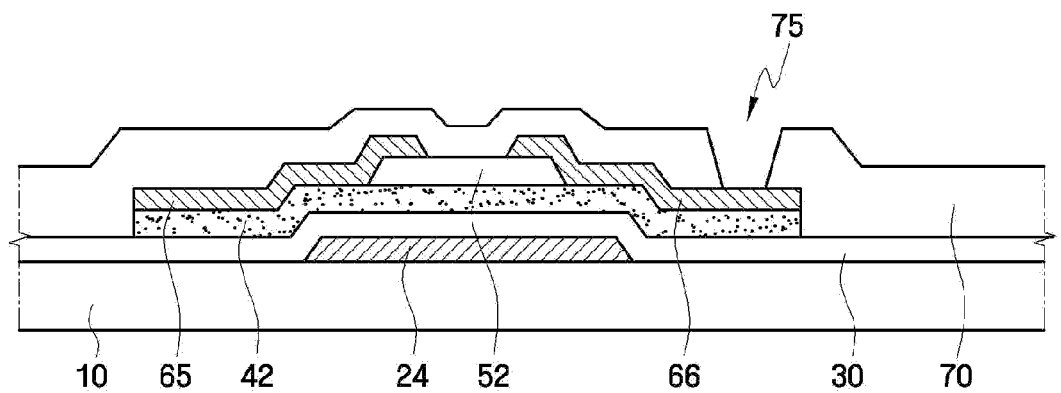

Referring to FIG. 6, a passivation layer 70 is formed, e.g. by CVD, on the data line 62, the source electrode 65, the drain electrode 66, the etch stopper 52, and the gate insulating layer 30 and then patterned to form a contact hole 75. The contact hole 75 exposes a portion of the drain electrode 66. The contact hole may alternatively expose a portion of the source electrode 65.

Referring to FIG. 2A, a transparent conductive layer is formed on the passivation layer 70 and patterned to form a pixel electrode 80. The pixel electrode 80 may be connected to the drain electrode 66 through the contact hole 75.

Although FIG. 2A shows a TFT having a bottom gate structure, in which the gate electrode 24 is disposed under the oxide semiconductor layer 42, other structures are possible. For example, the TFT may have a top gate structure, in which the gate electrode is disposed on the oxide semiconductor layer.

Figure 7:
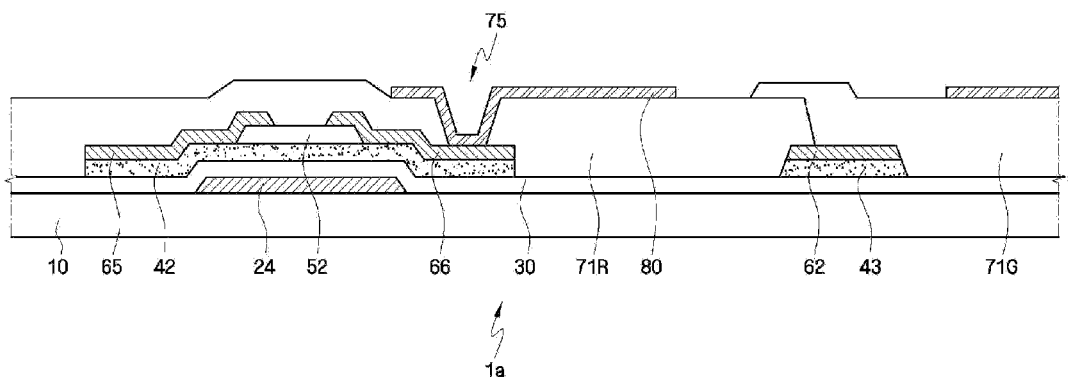
FIG. 7 is a cross-sectional view of a TFT panel according to an exemplary embodiment of the present invention.

FIG. 7 is a cross-sectional view of a TFT panel according to an exemplary embodiment of the present invention.

The exemplary embodiment of the TFT panel shown in FIG. 7 is substantially identical to the exemplary embodiment shown in FIG. 1 and FIG. 2A except that the passivation layer 70 is replaced with color filters 71R and 71G.

Referring to FIG. 7, a TFT panel 1a includes a gate insulating layer 30, an oxide semiconductor layer 42, and an etch stopper 52. A source electrode 65 and a drain electrode 66 are disposed on the oxide semiconductor layer 42 and the etch stopper 52. The etch stopper 52 prevents the portion of the oxide semiconductor layer 42 between the source electrode 65 and the drain electrode 66 from being exposed, thereby protecting the oxide semiconductor layer 42 from damage during an etching process. Accordingly, even though color filters 71R and 71G are formed instead of the passivation layer 70, the oxide semiconductor layer 42 can be protected. The red color filter 71R may overlap with the green color filter 71G near where the data line 62 is disposed on a portion 43 of the oxide semiconductor layer. As another alternative, an organic film can be formed on the substrate including the TFT instead of color filters 71R and 71G.

Figure 8:
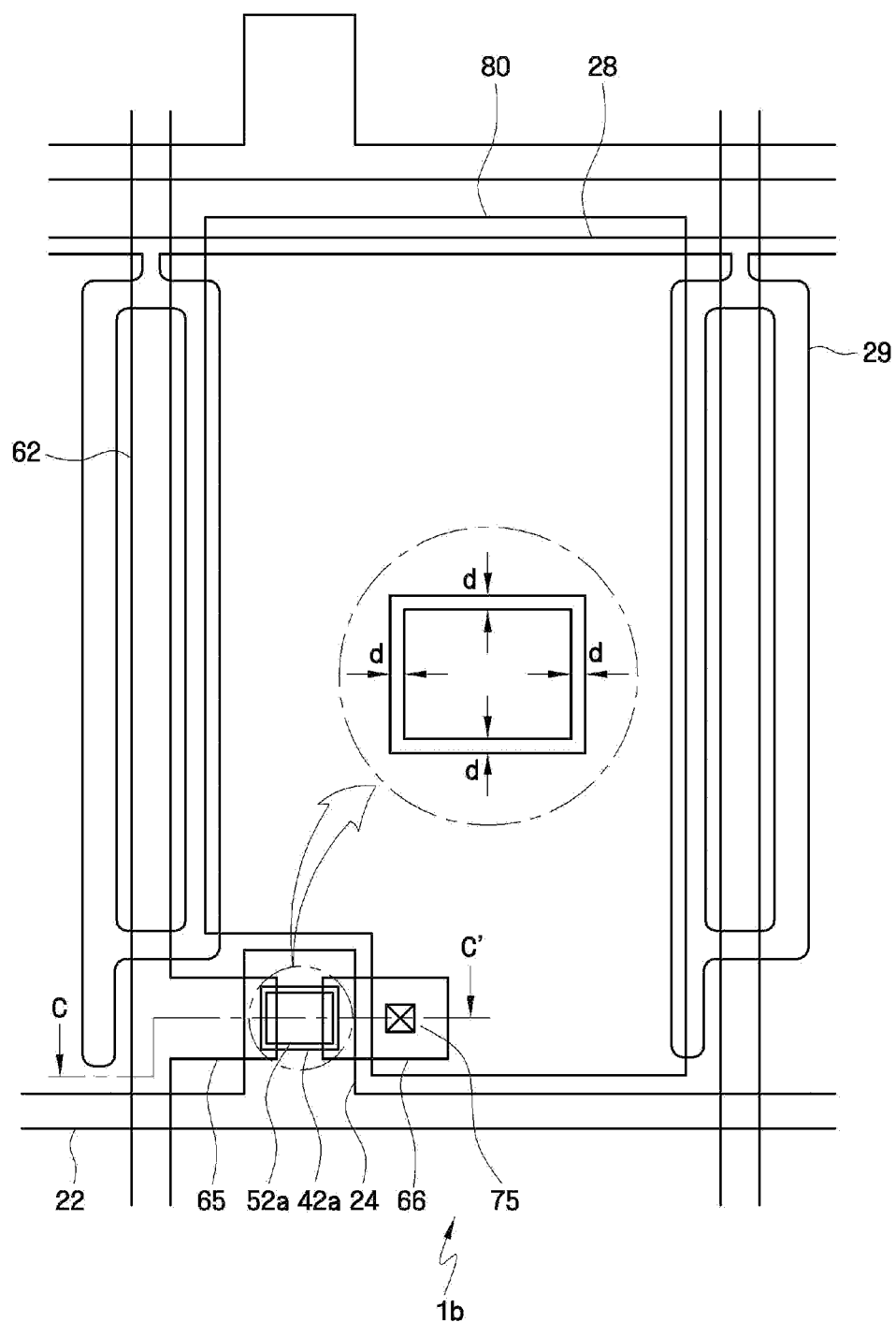
FIG. 8 is a plan view of a TFT panel according to an exemplary embodiment of the present invention.
Figure 9:
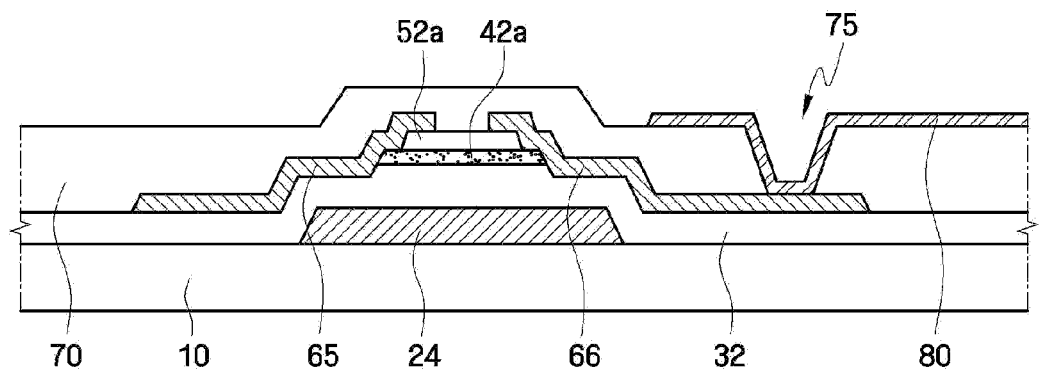
FIG. 9 is a cross-sectional view taken along line C-C' of FIG. 8.

FIG. 8 is a plan view of a TFT panel 1b according to an exemplary embodiment of the present invention, and FIG. 9 is a cross-sectional view taken along line C-C' of FIG. 8. This exemplary embodiment of the TFT panel 1b is substantially the same as the exemplary embodiment shown in FIG. 1 except for the configuration of an oxide semiconductor layer and an etch stopper. In this exemplary embodiment, the oxide semiconductor layer and the etch stopper are formed using the same mask. The same reference numerals will be used to refer to the same or like parts as those described in the exemplary embodiment of FIG. 1, and any further explanation will be omitted.

Referring to FIG. 1, FIG. 2A, and FIG. 2B, except for its channel region, the oxide semiconductor layer 42 can have substantially the same shape as the data line 62, source electrode 65, and drain electrode 66. Thus, the sidewalls of the data line 62, source electrode 65, and drain electrode 66 substantially coincide with the sidewalls of the oxide semiconductor layer 42, except for the channel region. Further, as FIG. 2A shows, the data line 62, source electrode 65, and drain electrode 66 are not disposed directly on sidewalls of the oxide semiconductor layer 42. On the other hand, referring to FIG. 8 and FIG. 9, a source electrode 65 and a drain electrode 66 cover at least one sidewall of an oxide semiconductor layer 42a. Further, an etch stopper 52a may have substantially the same shape as the oxide semiconductor layer 42a. At least one sidewall of the etch stopper 52a is disposed inside the perimeter of the oxide semiconductor layer 42a, thus permitting the source electrode 65 and the drain electrode 66 to be formed directly on a portion of a top surface of the oxide semiconductor layer 42a.

Referring to FIG. 8, because the oxide semiconductor layer 42a and the etch stopper 52a are formed using the same mask, the oxide semiconductor layer 42a and the etch stopper 52a may have substantially the same shape. Further, sidewalls of the etch stopper 52a are disposed inside the perimeter of the oxide semiconductor layer 42a. In other words, a pattern of the etch stopper 52a may be contained entirely within a perimeter of the oxide semiconductor layer 42a. Furthermore, as the enlarged portion contained within the broken circle of FIG. 8 shows, because the same mask is used to form the etch stopper 52a and the oxide semiconductor 42a, the distances "d" between corresponding sidewalls of the oxide semiconductor layer 42a and the etch stopper 52a may be substantially the same.

In an alternative exemplary embodiment of the present invention, the etch stopper 52a can be narrower than the oxide semiconductor layer 42a along the direction parallel with a gate line 22, like shown in FIG. 8. But unlike FIG. 8, the etch stopper 52a may be wider than and completely cover the oxide semiconductor layer 42a along the direction parallel with a data line 62, thereby protecting more of the oxide semiconductor layer 42a.

FIG. 10, FIG. 11, FIG. 12, FIG. 13, and FIG. 14 are cross-sectional views showing steps for manufacturing the TFT panel 1b of FIG. 8 according to an exemplary embodiment of the present invention.

Figure 10:
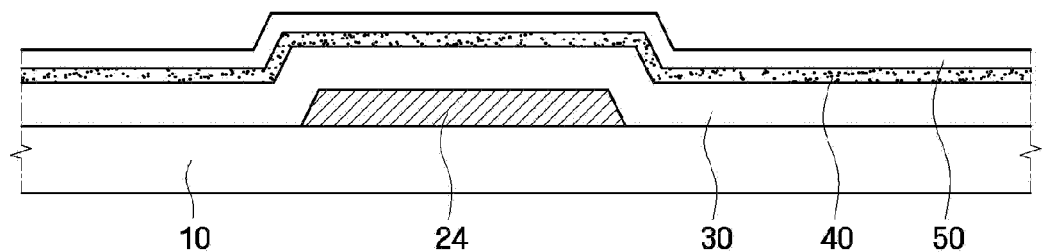
FIG. 10, FIG. 11, FIG. 12, FIG. 13, and FIG. 14 are cross-sectional views showing steps for manufacturing the TFT panel of FIG. 8 according to an exemplary embodiment of the present invention.

Referring to FIG. 8 and FIG. 10, a gate conductive layer (not shown) is formed on an insulating substrate 10, e.g. by sputtering, and patterned using a photolithographic process to form a gate line 22, gate electrode 24, storage electrode line 28, and storage electrode 29. A dry etch process or a wet etch process can be used to pattern the gate conductive layer. If the gate conductive layer is wet etched, etchant such as phosphoric acid, nitric acid, and acetic acid can be used. If the gate conductive layer is dry etched, chlorine based gas such as $Cl_2$ and $BCl_3$ can be used.

The insulating substrate 10 can include glass, such as soda lime glass and boron silicate glass, or plastic. The gate conductive layer can include a double-layered structure such as Al and Mo, or Ti and Cu or other appropriate conductive materials.

A gate insulating layer 30 is formed, e.g. by CVD, on the gate line 22 and the storage electrode line 28. An oxide semiconductor film 40 is formed, e.g. by sputtering, on the gate insulating layer 30, and an etch stopper layer 50 is formed, e.g. by CVD, on the oxide semiconductor film 40.

Figure 11:
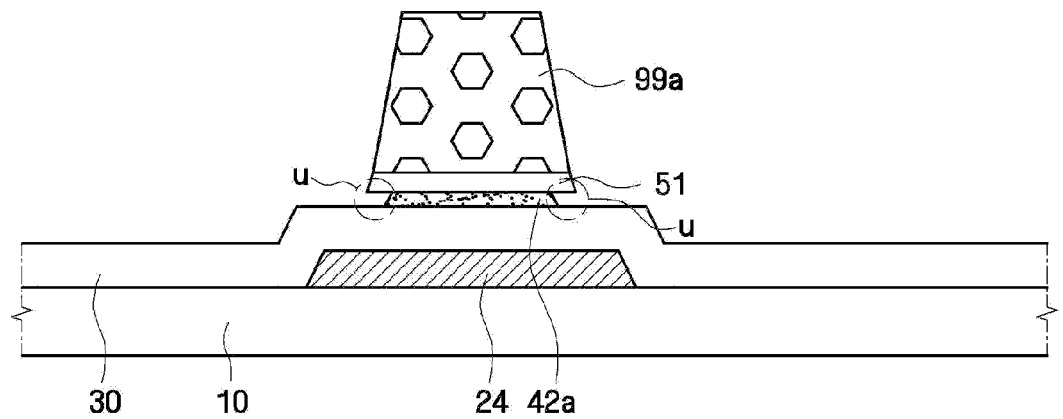

Referring to FIG. 8 and FIG. 11, a photo-resist layer (not shown) is formed on the etch stopper layer 50 and patterned to form a photo-resist pattern 99a. The etch stopper layer 50 having the photo-resist pattern 99a thereon may then be etched to form an interim etch stopper 51. Here, the etch stopper layer 50 may be etched using a dry etch process. A halogen based gas, such as $CF_6$, $CHF_6$, and $Cl_2$, can be used in the dry etch process.

After forming the interim etch stopper 51, the oxide semiconductor film 40 having the photo-resist pattern 99a and the interim etch stopper 51 thereon may be etched to form an oxide semiconductor layer 42a. Here, the oxide semiconductor film 40 may be etched using a wet etch process. Etchant such as phosphoric acid, nitric acid, and acetic acid can be used in the wet etch process.

Because the wet etch process may be an isotropic etch process, it forms an undercut U under the interim etch stopper 51. Thus, the oxide semiconductor layer 42a is narrower than the interim etch stopper 51.

Figure 12:
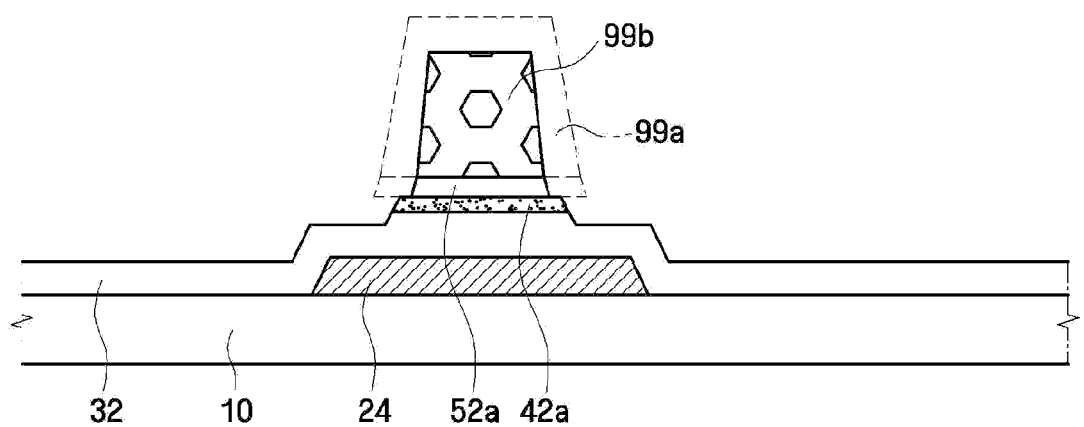

Referring to FIG. 12, the interim etch stopper 51 is etched to form an etch stopper 52a. Thus, per the above description and as shown in FIG. 10, FIG. 11, and FIG. 12, the oxide semiconductor layer 42a and the etch stopper 52a may be formed using a single mask (i.e., the mask used to form the photo-resist pattern 99a from the photo-resist layer (not shown)). Further, because the oxide semiconductor layer 42a and the etch stopper 52a are formed using a single mask and the etching processes described above, all sidewalls of the etch stopper 52a may be disposed inside the oxide semiconductor layer 42a. In other words, a pattern of the etch stopper 52a may be contained entirely within a perimeter of the oxide semiconductor layer 42a. Furthermore, as the enlarged portion contained within the broken circle of FIG. 8 shows, because the same mask is used to form the etch stopper 52a and the oxide semiconductor 42a, the distances "d" between corresponding sidewalls of the oxide semiconductor layer 42a and the etch stopper 52a may be substantially the same. This configuration increases the contact areas between the oxide semiconductor layer 42a and the source and drain electrodes 65 and 66 (shown in FIG. 8 and FIG. 13).

Here, the interim etch stopper 51 may be dry etched to form the etch stopper 52a. A gas mixture of $SF_6$ and $Cl_2$ can be used for the dry etch process. During the dry etch process, a portion of the gate insulating layer 30 and a portion of the photo-resist pattern 99a may be removed, thereby forming a gate insulating layer 32 and a smaller photo-resist pattern 99b.

Because a portion of the gate insulating layer 30 may be removed during the dry etch process, the gate insulating layer 32 can include a step portion in the area overlapping with the oxide semiconductor layer 42a. In other words, unlike gate insulating layer 30 (i.e., the non-etched gate insulating layer), gate insulating layer 32 (i.e., the etched gate insulating layer) includes regions with different thicknesses. Specifically, as FIG. 12 shows, the region of the gate insulating layer 32 disposed under the oxide semiconductor 42a and etch stopper 52a is thicker than the other regions of the gate insulating layer 32. Here, the region of the gate insulating layer 32 disposed under the oxide semiconductor 42a and etch stopper 52a is thicker than the other regions because this region is not etched during the dry etch process.

Alternatively, a half tone mask or a slit mask can be used to form the etch stopper 52a and the oxide semiconductor layer 42a. The half tone mask or the slit mask has a portion through which light partially transmits, thereby adjusting an amount of light irradiated on the underlying substrate. Specifically, a photo-resist layer may be formed on the etch stopper layer 50 of FIG. 10. The photo-resist layer is then exposed to light with the half tone mask or the slit mask, which would be disposed over the photo-resist layer. Light is blocked in the area of the photo-resist layer corresponding to the etch stopper 52a of FIG. 12, and the photo-resist layer remains with a determined thickness after a developing process. In the area of the photo-resist layer corresponding to the edges of the interim etch stopper 51 of FIG. 11, light partially transmits through the mask and a thinner photo-resist layer than the determined thickness is formed after the developing process. In the other area of the photo-resist layer, light fully transmits through the mask, and that area of the photo-resist layer is completely removed after the developing process. As a result, a photo-resist pattern having different thickness depending on the area is formed. The etch stopper layer 50 and the oxide semiconductor 40 having the photo-resist pattern thereon may then be etched, thereby forming the etch stopper 52a and the oxide semiconductor layer 42a with the same structure shown in FIG. 12.

Figure 13:
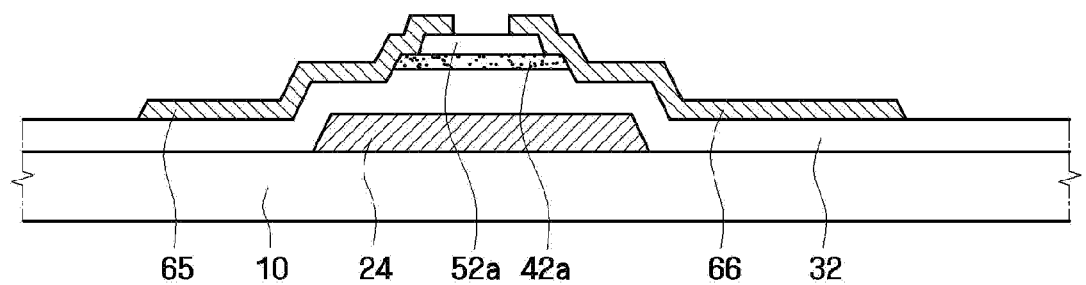

Referring to FIG. 8 and FIG. 13, a data conductive layer (not shown) is formed, e.g. by sputtering, on the etch stopper 52a and the oxide semiconductor layer 42a. The data conductive layer may be patterned using a photolithographic process to form a data line 62, which includes a source electrode 65, and a drain electrode 66. The source electrode 65 and the drain electrode 66 are spaced apart from each other with respect to the gate electrode 24. A portion of the etch stopper 52a between the source electrode 65 and the drain electrode 66 is exposed. Further, the source electrode 65 and the drain electrode 66 are formed on a portion of a top surface and sidewalls of the etch stopper 52a. Also, the source electrode 65 and the drain electrode 66 are formed on sidewalls and a portion of a top surface extending from the sidewalls of the oxide semiconductor layer 42a.

The data conductive layer may be patterned using a wet etch process. Here, the etch stopper 52a and the gate insulating layer 32 may be resistant to, and thus not damaged by, chemicals used in the wet etch process. Accordingly, the etch stopper 52a can protect the underlying oxide semiconductor layer 42a from damage from chemicals.

Figure 14:
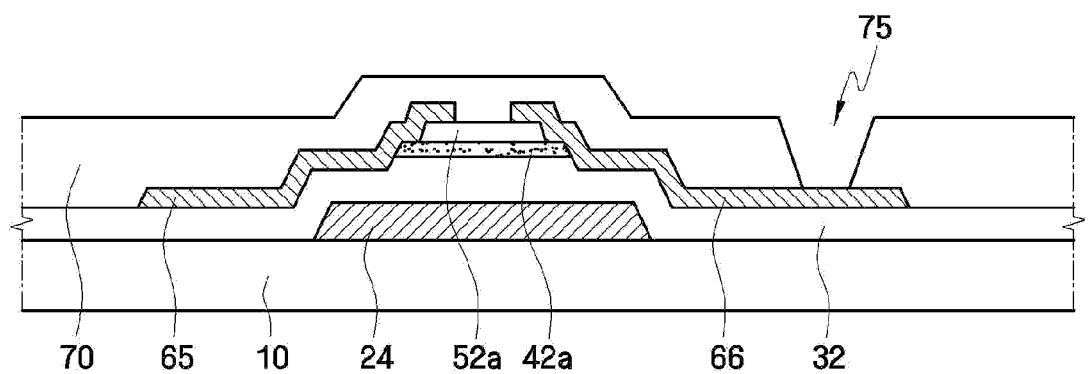

Referring to FIG. 14, a passivation layer 70 is formed, e.g. by CVD, on the data line 62, the source electrode 65, the drain electrode 66, the etch stopper 52a, and the gate insulating layer 32 and then patterned to form a contact hole 75. The contact hole 75 exposes a portion of the drain electrode 66. The contact hole may alternatively expose a portion of the source electrode 65.

Referring to FIG. 9, a transparent conductive layer is formed on the passivation layer 70 and patterned to form a pixel electrode 80. The pixel electrode 80 may be connected to the drain electrode 66 through the contact hole 75.

According to exemplary embodiments of the present invention, an etch stopper can be formed to protect an oxide semiconductor layer from damage resulting from a subsequent manufacturing process without increasing processing steps. Also, sidewalls of the etch stopper may be disposed within the perimeter of the oxide semiconductor layer, thereby increasing the contact area between the oxide semiconductor layer and source and drain electrodes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A panel comprising a thin film transistor, the panel comprising:
   a substrate;
   a first electrode on the substrate;
   a first insulating layer on the first electrode;
   an oxide semiconductor pattern on the first insulating layer;
   an etch stopper on the oxide semiconductor pattern;
   a second electrode and a third electrode on the etch stopper and the oxide semiconductor pattern,
   wherein the first insulating layer comprises a first region disposed under the etch stopper and a second region disposed outside the first region, and
   wherein a thickness of the first region exceeds a thickness of the second region.

2. The panel of claim 1, wherein an upper surface of the first region of the first insulating layer is a non-etched surface, and an upper surface of the second region of the first insulating layer is an etched surface.

3. The panel of claim 2, wherein at least one of the second electrode and the third electrode is disposed directly on the upper surface of the second region of the first insulating layer without being disposed directly on the upper surface of the first region of the first insulating layer.

4. The panel of claim 3, wherein the at least one of the second electrode and the third electrode is further disposed directly on a sidewall and an upper surface of the etch stopper.

5. The panel of claim 4, further comprising:
   a second insulating layer on the second electrode and the third electrode and comprising a contact hole exposing the second electrode;
   a fourth electrode on the second insulating layer and connected to the second electrode via the contact hole in the second insulating layer.

6. The panel of claim 5, wherein the second insulating layer comprises a passivation layer.

7. The panel of claim 5, wherein the second insulating layer comprises a color filter.

8. The panel of claim 5, wherein:
the oxide semiconductor pattern comprises one or more compounds represented by the formulas $A_xB_xO_x$ and $A_xB_xC_xO_x$;
A is In, Zn, Ga, Hf, or Cd;
B is Zn, Ga, Sn, or In;
C is Sn, Zn, Cd, Ga, In, or Hf;
O is atomic oxygen;
each x is independently a non-zero integer; and
A, B, and C are different from one another.

9. The panel of claim 8, wherein the oxide semiconductor pattern comprises one or more of InZnO, InGaO, InSnO, ZnSnO, GaSnO, GaZnO, GaZnSnO, GaInZnO, or HfInZnO.

10. The panel of claim 1, wherein at least one of the second electrode and the third electrode is disposed directly on a sidewall and an upper surface of the oxide semiconductor pattern.

11. The panel of claim 1, wherein a pattern of the etch stopper is contained entirely within a perimeter of the oxide semiconductor pattern.

* * * * *